United States Patent [19]

Anthony

[11] 4,394,712
[45] Jul. 19, 1983

[54] ALIGNMENT-ENHANCING FEED-THROUGH CONDUCTORS FOR STACKABLE SILICON-ON-SAPPHIRE WAFERS

[75] Inventor: Thomas R. Anthony, Schenectady, N.Y.

[73] Assignee: General Electric Company, Schenectady, N.Y.

[21] Appl. No.: 244,854

[22] Filed: Mar. 18, 1981

[51] Int. Cl.³ .............................................. H05K 1/14
[52] U.S. Cl. .................................. 361/411; 174/68.5; 361/395; 361/412
[58] Field of Search ............... 174/68.5; 361/412, 411, 361/395

[56] References Cited

U.S. PATENT DOCUMENTS

| | | | |
|---|---|---|---|
| 3,148,310 | 9/1964 | Feldman | 174/68.5 X |
| 3,811,186 | 5/1974 | Larnerd | 174/68.5 X |
| 3,835,531 | 9/1974 | Luttmer | 174/68.5 X |
| 3,904,934 | 9/1975 | Martin | 361/408 X |
| 4,067,104 | 1/1978 | Tracy | 361/412 X |
| 4,074,342 | 2/1978 | Honn et al. | 361/411 X |

OTHER PUBLICATIONS

McIntosh et al., Packaging of Integrated Circuits, IBM Tech. Disc. Bull., vol. 15, #6, 1972, pp. 1977 to 1080.

Primary Examiner—R. R. Kucia
Attorney, Agent, or Firm—Stephen S. Strunck; James C. Davis, Jr.; James Magee, Jr.

[57] ABSTRACT

Alignment-enhancing electrically conductive feed-through paths are provided for the high-speed low-loss transfer of electrical signals between integrated circuits of a plurality of silicon-on-sapphire bodies arrayed in a stack. The alignment-enhancing feed-throughs are made by a process involving the drilling of holes through the body, double-sided sputtering, electroplating, and the filling of the holes with solder by capillary action. The alignment-enhancing feed-throughs are activated by forming a stack of wafers and remelting the solder whereupon the wafers, and the feed-through paths, are pulled into alignment by surface tension forces.

8 Claims, 8 Drawing Figures

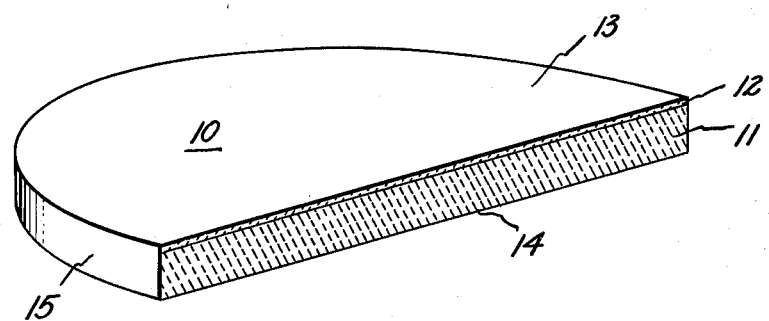
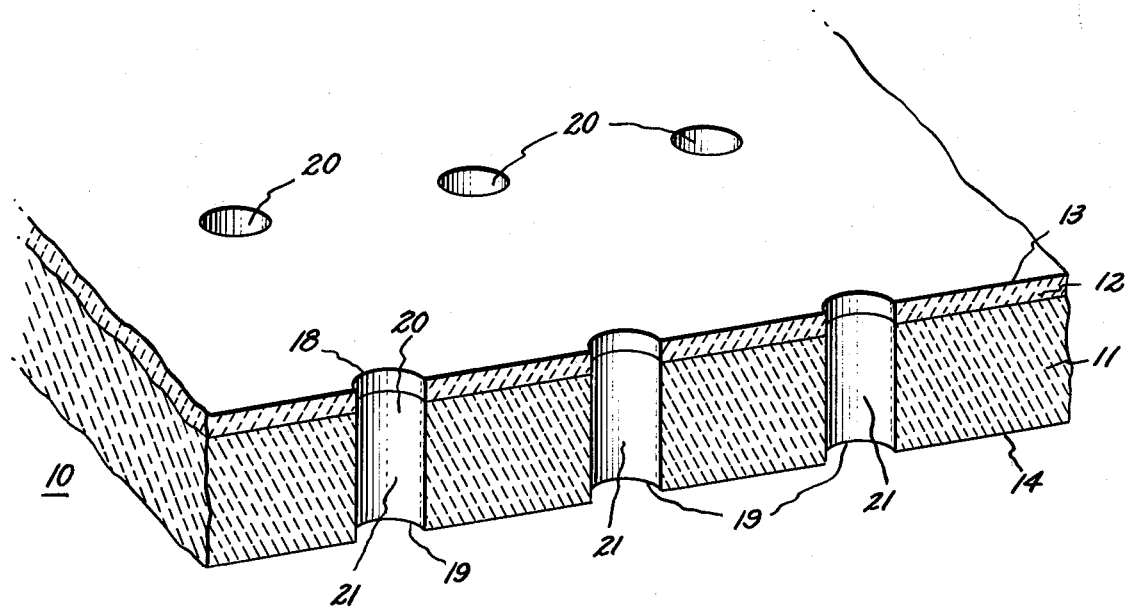

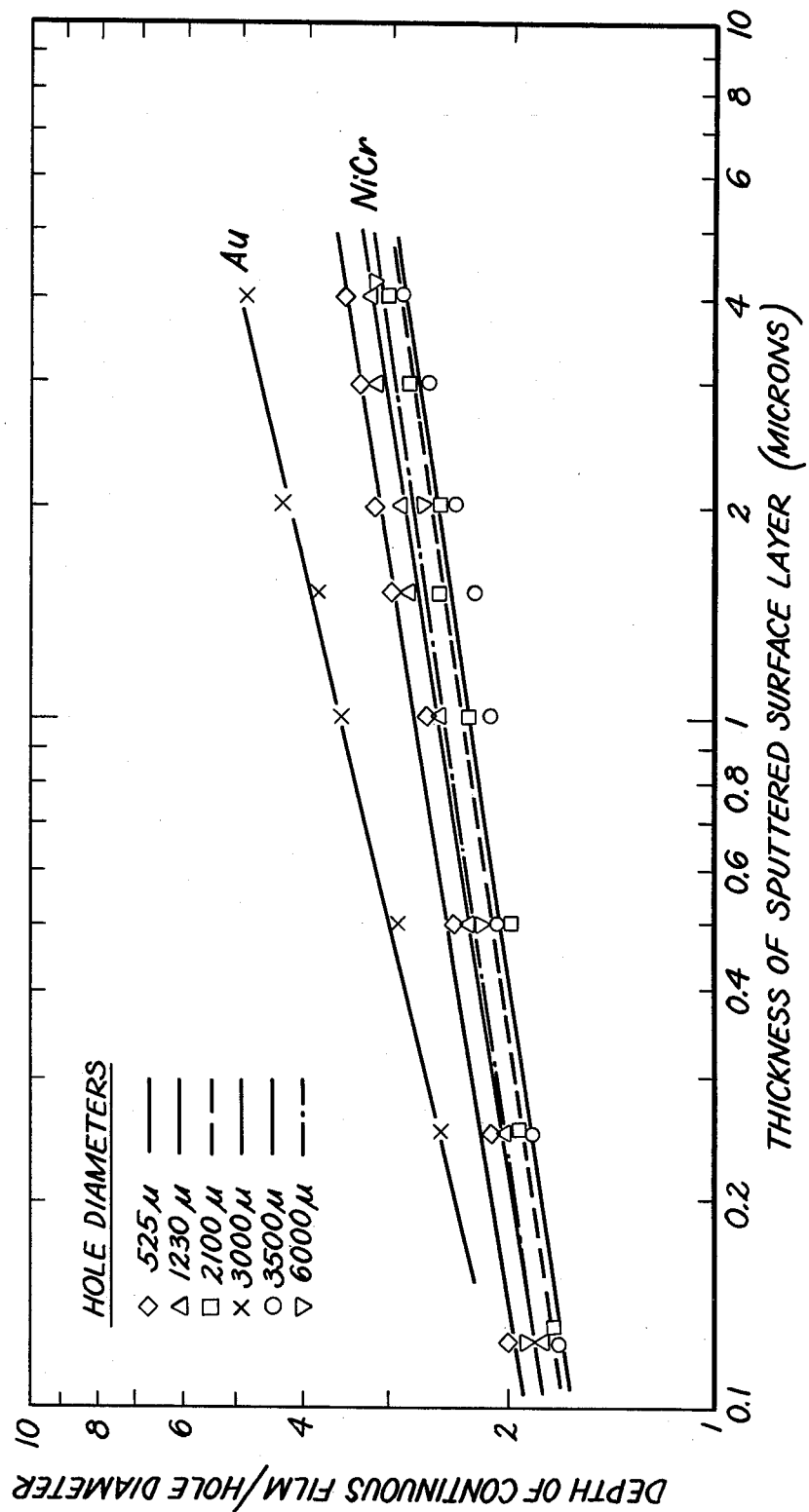

ALIGNMENT-ENHANCING FEED-THROUGH CONDUCTORS FOR STACKABLE SILICON-ON-SAPPHIRE WAFERS

The invention described herein was made in the performance of work under NASA Contract No. NAS5-25654 and is subject to the provisions of Sec. 305 of the National Aeronautics and Space Act of 1958 (72 Stat. 435; 42 U.S.C. 2457).

CROSS-REFERENCE TO RELATED APPLICATIONS

This invention is related to the following coassigned, copending U.S. Patent applications: Ser. No. 204,957 filed Nov. 7, 1980 and Ser. Nos. 285,656 and 285,668, both of which were filed July 21, 1981. The Ser. No. 285,656 application is a continuation-in-part of application Ser. No. 200,770, filed Oct. 27, 1980, and now abandoned. Application Ser. No. 423,334 filed Sept. 24, 1982, is a Division of the Ser. No. 285,656 application.

FIELD OF THE INVENTION

This invention relates generally to the manufacture of semiconductor devices and more particularly to the formation of alignment-enhancing electrically conductive feed-through paths in semiconductor bodies in order to reduce the number and length of conductive interconnections between logic and switching elements in a stacked multiwafer system.

BACKGROUND OF THE INVENTION

Computer science has developed in an era of computer technology in which wire interconnects were inexpensive and logic and switching elements were expensive. Integrated circuit technology has recently reversed the cost situation leaving wire interconnects as the more expensive component. Interconnections between the integrated circuits of a single chip or wafer, whether made of wires or strips of conducting material, are expensive because they occupy most of the space on the wafer and cause most of the delay in electronic signals passing through the system. The same reasoning holds for interconnections between wafers. Computer architecture theory has just begun to take the cost reversal generated by integrated circuit technology into consideration. As a result, computer design has not yet taken advantage of the full range of capabilities implicit in microelectronics.

Current advances in computer design involve the development of a massively parallel information processing system for ultrahigh speed processing of multiple digital data streams. Such multiple data streams are encountered in situations where interactions of the physical data are significant as, for example, in image processing and studies of weather conditions, economics, hydrodynamics and stresses. The massively parallel array processor with many processors operating simultaneously and in parallel requires many interconnections between processors. With multiple processors, the number of interconnections, the space occupied by interconnections, the delay time caused by interconnections, the power consumed in interconnections, and the cost of interconnections has increased as the square of the number of processors in the system.

The massively parallel array processor system is built utilizing Complementary Metal Oxide Semiconductor/-Silicon-on-Sapphire Large Scale Integration (CMOS/-SOS LSI) circuitry. Processor arrays on many individual silicon-on-sapphire wafers must also be interconnected. In current technology, all such interconnections must run out to a pad on the edge of a wafer or chip. Such an interconnection scheme has several disadvantages.

First, the number of interconnection pads on the periphery of an LSI circuit is very limited. The relatively small number of interconnection pads severely restricts the information flow to and from an LSI circuit. For example, a typical memory chip has 16,384 bits arranged in a 128 by 128 array. An entire row of 128 bits can be assessed at one time, but a selector enables only a single bit to pass to an output pin. A typical memory system is made of 2,048 such chips arranged in 64 groups of 32. Only 32 chips can place their outputs on the 32 wires that join the bus to the central processor. Of the 262,144 bits that move less than a millimeter on each chip, only 2,048 move 3 millimeters to get off their chip and only 32 move a meter to the processor. In other words, because of an effective traffic tie-up on the interconnections, only about eight-thousandths of the available density of the memory chip can be used simultaneously.

The second disadvantage of the interconnection scheme used by current technology is that a large fraction of the area of an LSI circuit is devoted to interconnections. This waste of a large area of a chip or a wafer is a direct consequence of the restriction of inerconnections to substantially two-dimensional configurations.

Advantageous use of three dimensional configurations has been made in the construction of printed circuit boards. Unfortunately, however, compared to printed circuit boards, semiconductor substrates are brittle single crystals and a large density of small diameter holes having high depth-to-diameter aspect ratios through these brittle substrates would be required to effectively utilize three dimensions. Previous methods of providing conventional conductive paths in three-dimensional configurations by placing the paths in layers on one chip, such as the interconnects between addressing lines in the many x-y crossovers required for large area crossover switches of the type used in communication satellites, have generally resulted in a decrease in the quality of the processed information due primarily to the phenomenon of cross-talk.

SUMMARY OF THE INVENTION

In accordance with the present invention, a large number of alignment-enhancing small diameter closely-spaced electrically conductive feed-throughs are introduced through bodies of semiconducor material typically used in information processing equipment. These electrically conductive feed-through paths reduce the number and length of conductive interconnections between logic and switching elements on a single wafer and between the wafers in a stacked multiwafer system thus providing, for example, increased speed and quality of information processing, decreased power requirements, and more compact packaging of microelectronic circuits.

In its most general aspects, the method of this invention for making alignment-enhancing feed-throughs comprises the steps of providing a plurality of holes through a body of semiconductor material, depositing a first thin layer of a metal on the internal surfaces of each hole, applying a second thin layer of an electrically conductive metal to the metallized internal surfaces of each hole, and filling the remaining volume of each hole with a low melting temperature metal, such as solder, by capillary action. The metal of the first layer is one such as gold or nichrome which can be effectively applied to the internal surfaces of the holes by means such as sputtering and is adherent to semiconductor materials. Electroplating and copper have been found to be an effective method and material, respectively, for the second layer.

The alignment-enhancing feed-throughs are activated, and a stacked array is produced, by forming a stack of the wafers and remelting the solder whereupon the wafers, and the feed-through paths, are pulled into final alignment by surface tension forces.

BRIEF DESCRIPTION OF THE DRAWINGS

The invention is more clearly understood from the following description taken in conjunction with the accompanying drawings wherein some details have been disproportionately enlarged for clarity and of which:

FIG. 1 is a schematic cross section of a typical silicon-on-sapphire body.

FIG. 2 is an enlarged schematic dimensional view in cross section of a section taken from the silicon-on-sapphire body of FIG. 1 following laser drilling of a square array of holes through the body.

FIG. 4 is a graph of the ratio of the depth to which a continuous film may be sputtered to the hole diameter as a function of the thickness of the surface layer.

DETAILED DESCRIPTION OF THE INVENTION

Figure 3:
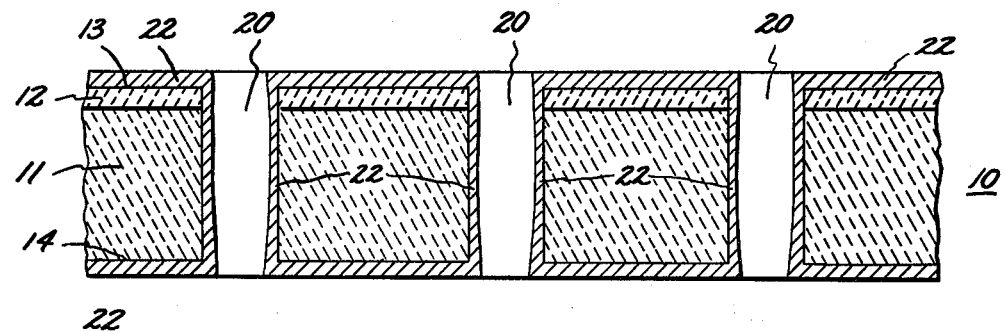
FIG. 3 is a schematic front view in cross section of the silicon-on-sapphire section of FIG. 2 after deposition of the first thin metallic layer.

Referring now to FIG. 1, there is shown a body 10 of semiconductor material; illustratively, the body 10 is a typical silicon-on-sapphire (SOS) wafer. The body 10 is a composite of a substrate of single crystal sapphire 11 and a contiguous overlaying epitaxially-grown layer of single crystal silicon 12. The body 10 has front, or top, 13 and back, or bottom, 14 major opposed substantially parallel surfaces and a peripheral edge area 15 interconnecting the front 13 and back 14 major surfaces. The two major surfaces are parallel to the ($1\bar{1}02$) plane of the single crystal sapphire 11 to within $\pm 2°$ and to the (100) plane of the single crystal epitaxial silicon 12 to within $\pm 2°$. The exposed silicon of the front major surface 13 of the wafer is polished to an optical finish smoother than about $\pm 0.1$ micron and the exposed sapphire of the back major surface 14 of the wafer 10 is ground to a finish smoother than about $\pm 0.5$ micron. One or more active integrated circuit semiconductor devices are ordinarily located in the silicon layer 12. The thickness of the epitaxial silicon layer 12 is typically less than about 4 microns while a typical thickness of the sapphire layer 11 is $325 \pm 25$ microns.

A plurality of holes 20, as shown in FIG. 2, are provided through SOS wafer 10 preferably using the laser beam techniques disclosed and claimed in above-referenced copending application Ser. No. 204,957. Holes provided in accordance with the referenced Ser. No. 204,957 application have apertures 18 and 19 in major surfaces 13 and 14, respectively, and an inner surface 21 interconnecting apertures 18 and 19. Typically, holes 20 have an average diameter of 2.5 mils and are spaced in arrays having center line-to-center line, i.e., axis-to-axis, spacings as small as about twice the hole diameter.

Next, a first metal layer 22, about 1 micron thick is deposited on the inner surfaces 21 of holes 20. Sputtering is the preferred technique and is conducted first with surface 13 and then with surface 14 facing the sputtering source, i.e., double-sided sputtering, to ensure complete coverage of inner surface 21. As shown in FIG. 3, the sputtered material will also be deposited on top 13 and bottom 14 surfaces of the semiconductor body 10. If surface deposits are undesirable in the finished product, surfaces 13 and 14 may be masked, using techniques known to those skilled in the art of semiconductor device manufacture, before the first metal layer 22 is deposited to aid in subsequent removal.

The first layer must, however, form a continuous adherent film on the entirety of inner surfaces 21 and be accessible to electrical contact in order to perform the next step. Gold was found to penetrate further into the holes than nichrome, thereby forming a deeper continuous film, when sputtered into holes having the same diameter. However, nichrome was found to adhere to SOS material better than gold. It was also discovered that sputtering was optimized when conducted in a vacuum such that the mean free path of an atom in the vacuum was greater than or equal to ten times the hole diameter.

Using the optimum vacuum and normal sputtering conditions, it was found that double sided sputtering would effectively place a conducting layer 22 inside holes 20 having diameters greater than or equal to 2 mils through a 13 mil thick SOS wafer (aspect ratio of 6.5:1) using gold and inside holes 20 having diameters greater than or equal to about 3 mils (aspect ratio of 6.3:1) using nichrome. An improvement would be expected using the bias sputtering technique. In a separate related experiment, however, it was surprisingly determined, as shown in FIG. 4, that the depth of the continuous film in the holes was a weak function of the amount of metal sputtered as measured by the thickness of the sputtered layer on surfaces perpendicular to the holes. Thus, there appears to be a practical limit on the aspect ratio of holes that may be coated by sputtering irrespective of the sputtering technique employed.

Figure 5:
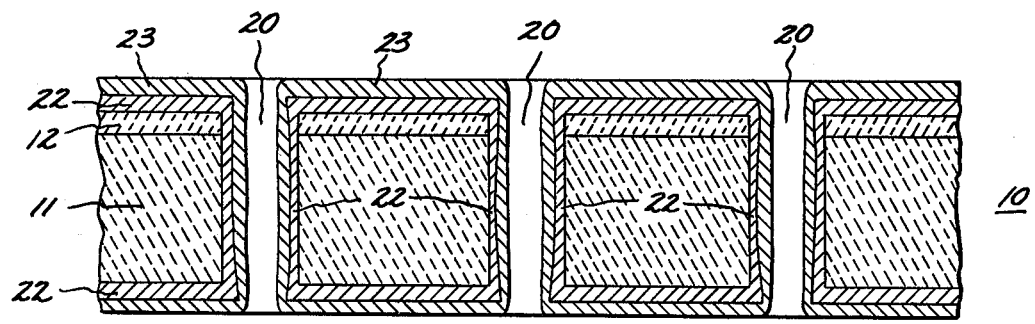
FIG. 5 is a schematic front view of FIG. 3 after deposition of the second thin metallic layer over the first metallic layer.

The electrical resistance of each hole 20 after double-sided sputtering ranged between 10,000 and 30,000 ohms. In order to reduce this resistance a second layer 23, shown in FIG. 5, was electroplated on the sputtered metallized base layer inside holes 20. Copper is a preferred material and a suitable electroplating solution and equipment are described in copending above-referenced application Ser. No. 285,656. The thickness of second layer 23 should be at least about 1 micron, but no more than about 10% of the hole diameter.

Initial attempts to electroplate copper on the inside diameter of the laser-drilled hole by conventional electroplating means failed because the copper would preferentially electroplate around the entrance and exit apertures, 18 and 19 of holes 20, sealing the hole leaving acid solution and little electroplated copper in the hole. While manually holding a specimen, it was accidentally discovered that moving the specimen to and fro in the electroplating solution perpendicular to the major surfaces of the wafer 10 at a speed greater than 4 cm/sec and a stroke length of about 8 cm prevented copper from building up at the entrance and exit of the hole. Subsequent analysis showed that the movement of liquid into and out of holes 20 caused erosion of material on the entrance and exit edges of the hole and prevented the build-up of copper electrodeposits in those regions. This erosion kept the entrance and exit of each hole open and allowed an even electroplated copper film to form on the interior of laser drilled holes 20. The resistance of a double-sided sputtered and electroplated hole was on the order of about $10^{-5}$ ohms.

Occasionally, as will be explained in more detail below, it may be desirable to form an elevated rim, termed a relief electroplate, of copper material around the apertures 18 and 19 of holes 20 rising above the plane of surfaces 13 and 14. The relief electroplate is accomplished by stopping the to and fro motion of the wafers in the electroplating bath for a few minutes towards the end of the electroplating operation to allow the formation of the copper rim around the hole apertures by preferential electroplating in those regions.

At this stage in the process, the SOS wafers may be processed, using conventional techniques known to those skilled in the art of semiconductor device manufacture, to provide signal paths between the active devices on the surfaces and the feed-through conductors.

Figure 6:
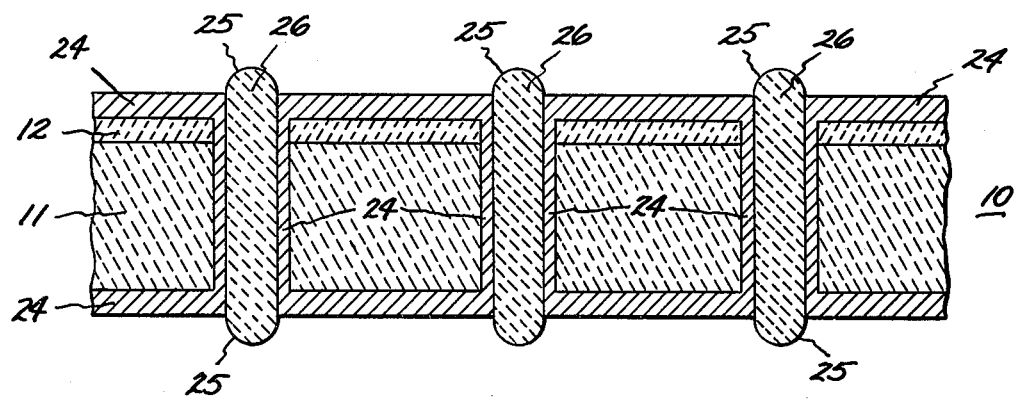
FIG. 6 is a schematic front view in cross section of several completed alignment-enhancing electrically conductive feed-through paths in a stackable silicon-on-sapphire wafer.

Next, the SOS wafer 10 with the sputtered and electroplated materials are floated on a solder bath whereupon solder is drawn into the holes by capillary action since solder wets copper. On withdrawal of the wafer from the solder bath, convex solder menisci 25 are left at the entrance and exit apertures, 18 and 19 of holes 20 on both sides of the wafer as shown in FIG. 6. In FIG. 6, layers 22 and 23 have been replaced by a single layer 24 for clarity. The fabrication of the alignment-enhancing feed-through conductors 26 is now complete.

Figure 7:
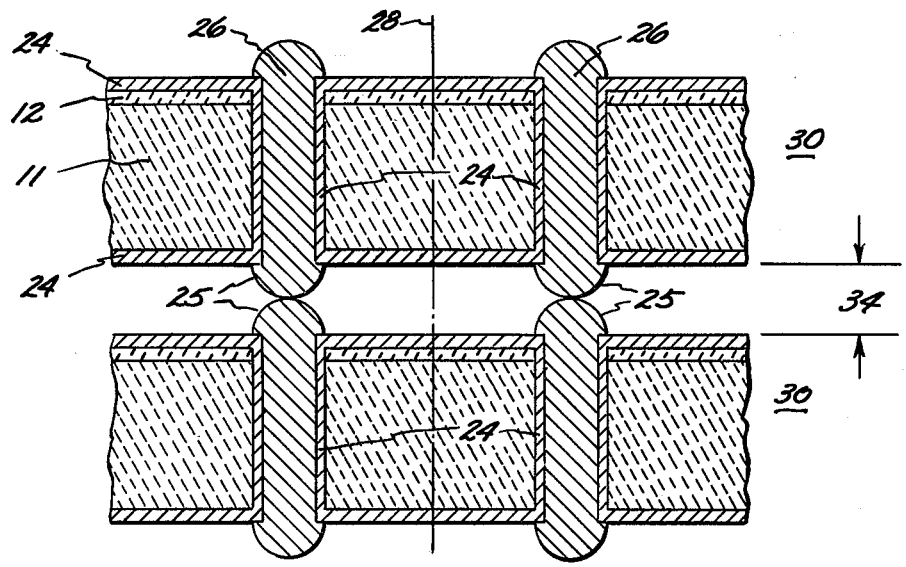
FIG. 7 is a schematic front view in cross section of a stack of two silicon-on-sapphire wafers of FIG. 6 prior to the solder remelt operation.
Figure 8:
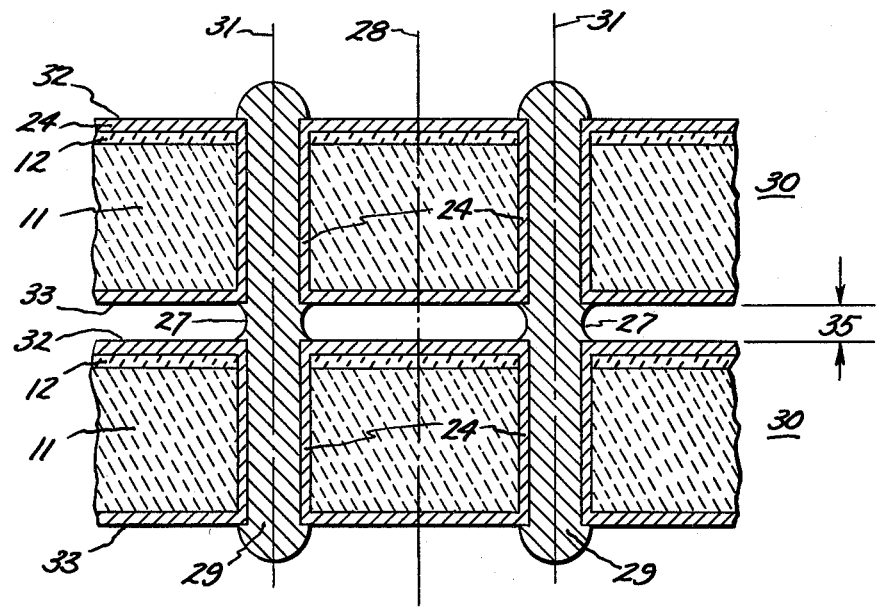
FIG. 8 is a schematic front view in cross section of the wafers of FIG. 7 in the form of an aligned stacked array following the solder remelt operation.

To form an array of CMOS/SOS wafers electrically interconnected by the alignment-enhancing feed-throughs, SOS wafers 30 with solder-filled feed-throughs 26 are next manually stacked and aligned one on top of another. As shown in FIG. 7, for a pair of wafers from such a stack, the solder menisci 25 on adjoining wafers are thus mated and a gap 34 is formed between any given wafer and the next adjacent wafer. During a brief remelt, capillary forces cause the abutting solder menisci 25 to flow together, effect the final alignment, and form conductive solder bridges 27 between adjacent SOS wafers 30, as shown in FIG. 8. Capillary tension of one million menisci, the number expected for a typical stacked array for the massively parallel processor, equals a net force of 40 grams which will pull any wafers out of alignment into final alignment during the remelt.

Final gaps 35 are established between wafers in the completed stack by spacers of an inert material or by the previously referred to relief electroplates. Initial gaps 34 and final gaps 35 may be the same. Gaps 35 between wafers should be less than the circumference of the feed-throughs, or else the molten solder bridge 27 between the wafers becomes unstable and may break apart. Thus, for a 3-mil diameter feed-through, the distance between wafers should be less than 9.4 mils (pi times 3). A greater separation distance between wafers can be obtained by giving the copper layer of the feed-throughs a relief electroplate as described above, however, the maximum separation distance between wafers in this case should not exceed two times the relief height plus the circumference of the feedthrough to avoid solder bridge instability.

In a completed stack of semiconductor bodies, which may number in the hundreds for the massively parallel processor, the major surfaces, 32 and 33 as viewed in FIG. 8, of the semiconductor bodies 30 are perpendicular to the axis of the stack 28. A plurality of feed-through conducting paths 29, which may also number in the hundreds for the massively parallel processor, extend the height, or length, of the stack. These feed-throughs, may be used to transfer electrical signals from any given active device on any given semiconductor body to one or more other active devices on any other semiconductor body, or bodies, or on the same semiconductor body. Due to the alignment-enhancing characteristics of the feed-throughs of this invention, the feed-through paths and their axes 31 are substantially mutually parallel to each other and to the axis of the stack 28. These feed-throughs have a substantially circular cross section when viewed in a plane oriented perpendicular to axes 31. When the plane is located between the top and bottom major surfaces 32 and 33 of body 30, the circular cross section is composed of three materials. The third, or core, material is the lead tin alloy. Circularly encompassing the core material is the second or electroplated material. A first outermost material circularly encompasses the secnd and core materials. In the regions between the bodies 30, i.e., between top surfaces 32 and bottom surfaces 33, the circular cross sections are substantially comprised of only the core material.

Although this invention has been described with particular reference to silicon-on-sapphire material, the novel technology and objectives of this invention of preparing a body with alignment-enhancing feed-through conductors is broadly applicable to other materials of the semiconductor arts including, for example, silicon (Si), germanium (Ge), gallium phosphide (GaP), gallium arsenide (GaAs), indium antimonide (InSb), cadmium telluride (CdIe), and zinc sulfide (ZnS). The invention may also be practiced with insulating materials such as alumina, quartz, glass, and beryllium oxide where such materials, with the alignment-enhancing feed-throughs therethrough, would be necessary or desirable in the stack, in other locations within the processor, or in other electronic applications.

Further, while the invention has been particularly shown and described with reference to several preferred embodiments thereof, it will be understood by those skilled in the art that various changes in form and detail may be made therein without departing from the true spirit and scope of the invention as defined by the appended claims.

I claim as my invention:

1. An article of manufacture comprising in combination:

(a) a plurality of bodies, said bodies being disposed in an array, each said body being adjacent to a next body with a relatively uniform gap therebetween, each said body having top and bottom major opposed surfaces substantially parallel to each other and an outer peripheral edge area interconnecting said major surfaces, said array having an array axis, said array axis being substantially perpendicular to the major surfaces of each body of said array; and (b) means for electrically interconnecting said bodies, said means
   (i) having a substantially circular cross section,
   (ii) having a plurality of materials of construction, said materials being arranged about said cross section in the region between said top and bottom surfaces as a first core material, a second material circularly encompassing said core material and a third outermost material circularly encompassing said first and second materials, the material of said cross section in said gap being substantially said first core material;
   (iii) extending through and between each said body in said array,
   (iv) having a means axis, said means axis being substantially parallel to said array axis, and
   (v) being arranged in a substantially periodic means array, said means array having a means axis-to-means axis spacing substantially equal to twice the diameter of said cross section.

2. The article of claim 1 wherein each said body is composed of a single material, said single material being one selected from the group consisting of silicon, germanium, gallium arsenide, gallium phosphide, indium antimonide, cadmium telluride and zinc sulfide.

3. The article of claim 1 wherein each said body is a composite, each said body having a single crystal sapphire substrate and a contiguous overlaying epitaxially-grown layer of single crystal silicon, said top major surface being the exposed surface of said silicon layer, said bottom major surface being the exposed surface of said sapphire substrate and said outer peripheral edge area encompassing both said sapphire substrate and said layer of silicon.

4. The article of claim 1 wherein said body is composed of an insulating material, said insulating material being one selected from the group consisting of alumina, quartz, glass, and beryllium oxide.

5. The article of claim 1 wherein said first core material is a lead-tin alloy, said second material is copper, and said third outermost material is gold.

6. The article of claim 1 wherein said first core material is a lead-tin alloy, said second material is copper, and said third outermost material is nichrome.

7. The article of claim 1 wherein said gap is less than or equal to the circumference of said circular cross section.

8. The article of claim 1 wherein said gap is less than or equal to the relief height plus the circumference of said circular cross section.

* * * * *